United States Patent
Kim

(10) Patent No.: US 6,338,154 B2
(45) Date of Patent: *Jan. 8, 2002

(54) APPARATUS AND METHOD FOR GENERATING ADDRESSES IN A BUILT-IN SELF MEMORY TESTING CIRCUIT

(75) Inventor: Heon-cheol Kim, Yongin (KR)

(73) Assignee: Samsung Electronics Co, Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,242

(22) Filed: Apr. 14, 1998

(30) Foreign Application Priority Data

Jul. 2, 1997 (KR) .............................................. 97-30662

(51) Int. Cl.[7] ......................... G01R 31/28; G06F 11/00
(52) U.S. Cl. ....................... 714/743; 365/201; 365/233; 365/222; 713/501
(58) Field of Search ................................ 714/718, 720, 714/730, 726, 732–734, 42, 30, 710, 719, 743; 365/185.09, 185.11, 200, 201, 222, 230.03, 189.01, 189.08, 239, 233; 712/11, 20, 13, 16, 245; 711/114, 119; 713/501–502; 326/38, 40; 708/232, 252; 704/200

(56) References Cited

U.S. PATENT DOCUMENTS

| | | | | |
|---|---|---|---|---|
| 4,835,774 A | * | 5/1989 | Ooshima et al. | 714/719 |
| 4,858,178 A | * | 8/1989 | Breuninger | 713/501 |
| 5,033,048 A | * | 7/1991 | Pierce et al. | 714/719 |
| 5,216,748 A | * | 6/1993 | Quenot et al. | 704/200 |
| 5,481,671 A | * | 1/1996 | Fujisaki | 714/8 |
| 5,790,468 A | * | 8/1998 | Oh | 365/222 |
| 5,987,244 A | * | 11/1999 | Kau et al. | 395/555 |
| 6,011,748 A | * | 1/2000 | Lepejian et al. | 365/233 |

FOREIGN PATENT DOCUMENTS

| | | | | |
|---|---|---|---|---|
| KR | 91-3602 | 6/1991 | | G11C/11/40 |
| KR | 88-5777 | 5/1998 | | G06F/11/22 |

OTHER PUBLICATIONS

Programmable Memory Controller; IBM Technical Disclosure Bulletin, Feb. 1989, US; NN8902351: pp 351–354.*

Pattern Generator for Memory Test System; IBM Technical Disclosure Bulletin, Aug. 1983, US; NA83081078: pp 1078–1079.*

R. N. Zoebel, "Some alternative techniques for hardware address generators for digital signal processors", Circuits and Sytems, 1988., IEEE International Symposium on. 1988, pp. 69–72 vol. 1.*

* cited by examiner

Primary Examiner—Albert DeCady
Assistant Examiner—Guy Lamarre
(74) Attorney, Agent, or Firm—Mills & Onello, LLP

(57) ABSTRACT

A memory address generating apparatus and method of a dynamic memory testing circuit for generating addresses for testing a dynamic memory which uses all the available addresses of the dynamic memory, which does not use the most significant addresses, and which does not use middle addresses among all the available addresses are provided. The address generator can obtain an up-counted address by up counting the addresses used by the dynamic memory. It can obtain a down-counted address by inverting the N-bit up-counted value, or by subtracting the N-bit up-counted value from the maximum address, or by combining the inverted MSB portion of the N-bit up-counted value with the LSB portion of the N-bit up-counted value subtracted from the LSB portion of the maximum address used in the dynamic memory. The down and up counted addresses are used as addresses for selectively testing the dynamic memory according to a selected testing method.

37 Claims, 4 Drawing Sheets

APPARATUS AND METHOD FOR GENERATING ADDRESSES IN A BUILT-IN SELF MEMORY TESTING CIRCUIT

BACKGROUND OF THE INVENTION

1. Field of the Invention

The present invention relates to testing a memory and more particularly to an address generator of a built-in self test circuit for testing a memory such as a dynamic random access memory (DRAM) and an address generating method thereof.

2. Description of the Related Art

A built-in self test (BIST) circuit can typically be used as part of a memory testing circuit to test a memory. In a DRAM BIST, the memory to be tested is a DRAM. An address generator in such a BIST circuit is used to generate addresses of the memory to access memory locations to be tested and therefore typically performs many up and down counting operations according to the method being used to test the memory. In the case of an address generator which uses an up/down counter, the size of the circuitry becomes an important consideration since such counters can be very large. Accordingly, it is hard to optimize the area of such devices.

In the case of testing a DRAM which does not use all its available addresses, if the addresses are generated using an up/down counter, various additional circuits are necessary to accomodate the skipping of addresses. This additional circuitry adds to the difficulty in optimizing the area of the BIST circuit including the address generator. Also, in the case that the DRAM does not use all the available addresses, if the address generator is designed using the up/down counter or separate up and down counters, respective counters for counting the column address and the row address of the DRAM are produced. This also greatly increases circuit size and complexity. Also, the hardware of the BIST controlling portion for controlling the up/down counter or the up and down counters can be very large and complex.

SUMMARY OF THE INVENTION

It is a first object of the present invention to provide an address generator of a dynamic memory testing circuit, for generating addresses for testing a dynamic memory which uses all the available addresses.

It is a second object of the present invention to provide an address generator of a dynamic memory testing circuit, for generating addresses for testing a dynamic memory which does not use some of the addresses of the memory, and more particularly, a dynamic memory which does not use its most significant addresses among all the available addresses.

It is a third object of the present invention to provide an address generator of a dynamic memory testing circuit, for generating addresses for testing a dynamic memory which does not use some of the middle addresses among all the available addresses.

It is a fourth object of the present invention to provide an address generating method of a dynamic memory testing circuit, for generating addresses for testing a dynamic memory which uses all its available addresses.

It is a fifth object of the present invention to provide an address generating method of a dynamic memory testing circuit, for generating addresses for testing a dynamic memory which does not use some of the addresses of the memory, and more particularly, a dynamic memory which does not use its most significant addresses among all the available addresses.

It is a sixth object of the present invention to provide an address generating method of a dynamic memory testing circuit, simply generating addresses for testing a dynamic memory which does not use some of the middle addresses among all the available addresses.

To achieve these and other objects, there is provided an address generator of a dynamic memory testing circuit for testing the dynamic memory which uses all the available addresses, comprising an N-bit binary up counter where N is the total of the number of memory row address bits and the number of column address bits, an inverting means, and a first selecting means. The N-bit binary up counter performs an up counting operation and outputs the counted value of N bits as an address used by the dynamic memory. The inverting means inverts the counted value of N bits and outputs the inverted value. The first selecting means selectively outputs either the output of the inverting means or the counted values of N bits to the dynamic memory, depending on the state of a select signal generated corresponding to a step of the process of testing the dynamic memory.

In accordance with another aspect of the invention, there is provided an address generator of a dynamic memory testing circuit for testing a dynamic memory which does not use some of the most significant addresses among all the available addresses, comprising an N-bit binary up counter where N is the total of the number of memory row address bits and the number of column address bits, a subtracting means, and a first selecting means. The N-bit binary up counter performs an up counting and outputs the counted value of N bits as an address used by the dynamic memory. The subtracting means subtracts the counted value of N bits from the maximum address and outputs the subtracted value of N bits. The first selecting means selectively outputs either the subtracted value of N bits or the counted values of N bits to the dynamic memory depending on the state of a select signal generated corresponding to a step of the process of testing the dynamic memory.

In accordance with another aspect of the invention, there is provided an address generator of a dynamic memory testing circuit for testing the dynamic memory which does not use some of the middle addresses among all the available addresses, comprising an N-bit binary up counter where N is the total of the number of memory row address bits and the number of column address bits, an inverting means, a subtracting means, a bit combining means, and a first selecting means. The N-bit binary up counter performs an up counting operation and outputs the counted value of N bits as an address used by the dynamic memory. The inverting means inverts the most significant bit (MSB) portion of the counted value of N bits and outputs the inverted value. The subtracting means subtracts the least significant bit (LSB) portion among the counted values of N bits from the LSB portion of the maximum address used in the dynamic memory and outputs the result. The bit combining means combines the output of the inverting means with the output of the subtracting means. The first selecting means selectively outputs to the dynamic memory either the output of the bit combining means or the counted values of N bits, depending on the state of a first select signal generated corresponding to a step of the process of testing the dynamic memory.

In accordance with another aspect of the invention, there is provided a method for generating addresses of a dynamic memory testing circuit for testing a dynamic memory which uses all the available addresses, comprising the steps of (a) obtaining addresses of N bits used by the dynamic memory by performing an up counting operation, the number N being the total of the number of memory row address bits and the number of column address bits, (b) inverting the counted N-bit address, (c) determining whether the dynamic memory is to be tested by increasing or decreasing addresses, (d) generating the N-bit address as addresses for testing the dynamic memory in the case of testing the dynamic memory by increasing the addresses, and (e) generating inverted N-bit addresses as addresses for testing the dynamic memory in the case of testing the dynamic memory by decreasing the addresses.

In accordance with another aspect of the invention, there is provided a method for generating addresses of a dynamic memory testing circuit for testing the dynamic memory which does not use some of most significant addresses among all the available addresses, comprising the steps of (a) obtaining N-bit addresses used by the dynamic memory by performing an up counting operation, the number N being the total of the number of memory row address bits and the number of column address bits, (b) subtracting the N-bit address from the maximum address, and (c) determining whether the dynamic memory is to be tested by increasing or decreasing the addresses, (d) generating the N-bit addresses for testing the dynamic memory when the dynamic memory is to be tested by increasing the addresses, and (e) generating the subtracted result as an address for testing the dynamic memory when the dynamic memory is to be tested by decreasing the addresses.

In accordance with another aspect of the invention, there is provided a method for generating addresses of a dynamic memory testing circuit for testing the dynamic memory which does not use some of the middle addresses among all the available addresses, comprising the steps of (a) obtaining the N-bit addresses used by the dynamic memory by performing an up counting operation, the number N being the total of the number of memory row address bits and the number of column address bits, (b) inverting the MSB portion in the N-bit address, (c) subtracting the LSB portion of the N-bit address from the LSB portion of the maximum address used by the dynamic memory, (d) combining the inverted result with the subtracted result, (e) determining whether the dynamic memory is to be tested by increasing or decreasing the addresses, (f) generating the N-bit address as an address for testing the dynamic memory in the case of testing the dynamic memory by increasing the addresses, and (g) generating the combined result as an address for testing the dynamic memory in the case of testing the dynamic memory by decreasing the addresses.

In each of these aspects of the invention, a down counter can be used instead of an up counter. In either case, the address generating apparatus and method of the invention provide memory testing addresses in either an ascending or descending order, depending on the status of control signals used to set the mode of operation as desired.

The invention can operate to generate testing addresses in the desired order and using only the selected portions of addresses using only a single counter, either an up counter or a down counter. Because only a single counter is used, significant savings in counter circuit size and complexity can be realized. In addition, because only a single counter can be used, the associated controlling circuitry is also smaller and less complex and, therefore, less costly to develop and manufacture.

BRIEF DESCRIPTION OF THE DRAWING(S)

The above objects and advantages of the present invention will become more apparent from the following detailed description of preferred embodiments thereof with reference to the attached drawings in which.

DESCRIPTION OF THE PREFERRED EMBODIMENT(S)

Hereinafter, the configuration and operation of a DRAM BIST circuit which uses an address generator according to the present invention and an address generating method thereof will be described with reference to the attached drawings.

Figure 1:
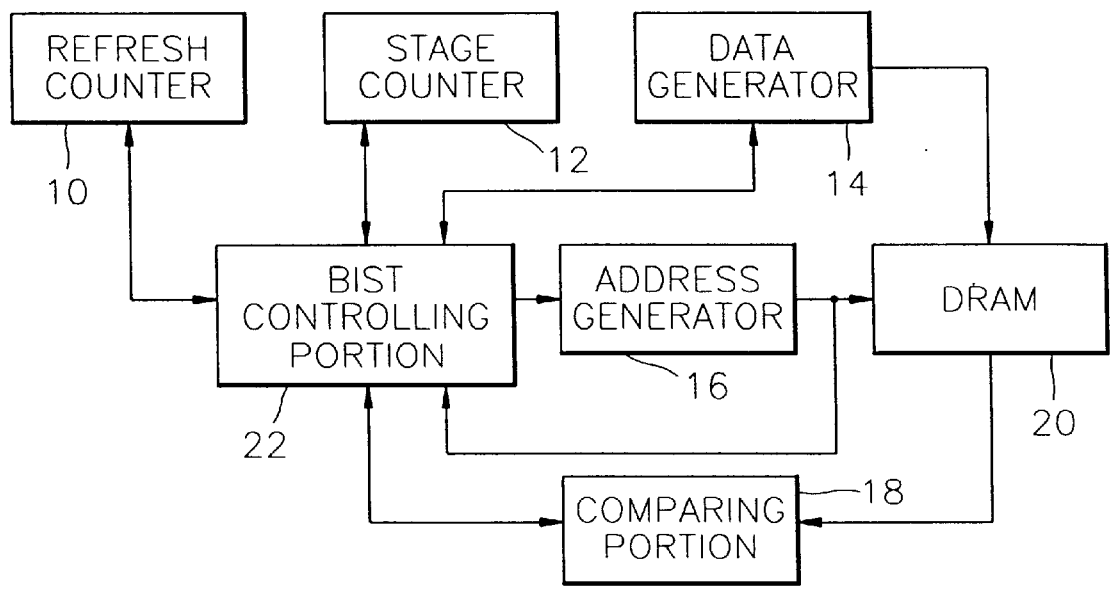
FIG. 1 is a schematic block diagram of a DRAM BIST circuit in accordance with the invention.

Referring to FIG. 1, a general DRAM BIST circuit includes a refresh counter 10, a stage counter 12, a data generating portion 14, an address generating portion 16, a comparing portion 18, and a DIST controlling portion 22. The refresh counter 10 determines a refresh timing of a DRAM 20. The stage counter 12 counts the respective steps of a memory testing method which proceeds by increasing or decreasing the memory addresses. The counter 12 outputs the counted result to the address generating portion 16 through the BIST controlling portion 22.

The data generating portion 14 generates data to be written in the DRAM 20 and outputs reference data to the comparing portion 18 through the BIST controlling portion 22. The BIST controlling portion 22 controls the refresh counter 10, the stage counter 12, the data generating portion 14, and the comparing portion 18 in order to test the DRAM 20. The reference data is used for discriminating whether the data read from the DRAM 20 is correct. The comparing portion 18 compares data read from the DRAM 20 with the reference data output from the BIST controlling portion 22 and outputs the compared result to the BIST controlling portion 22. The BIST controlling portion 22 determines from the compared result whether errors exist in data stored in the DRAM 20. The address generating portion 16 performs an up/down counting operation in response to a control signal output from the BIST controlling portion 22 and outputs the generated addresses to the DRAM 20 and the DIST controlling portion 22. Using the address generated by the address generating portion 16, the contents of the addressed DRAM location are read for comparison with the associated reference data.

Hereinafter, the configuration and operation of the address generator according to the present invention corresponding to the address generating portion 16 shown in FIG. 1 and an address generating method performed in the address generator will be described with reference to the attached drawings.

Figure 2:
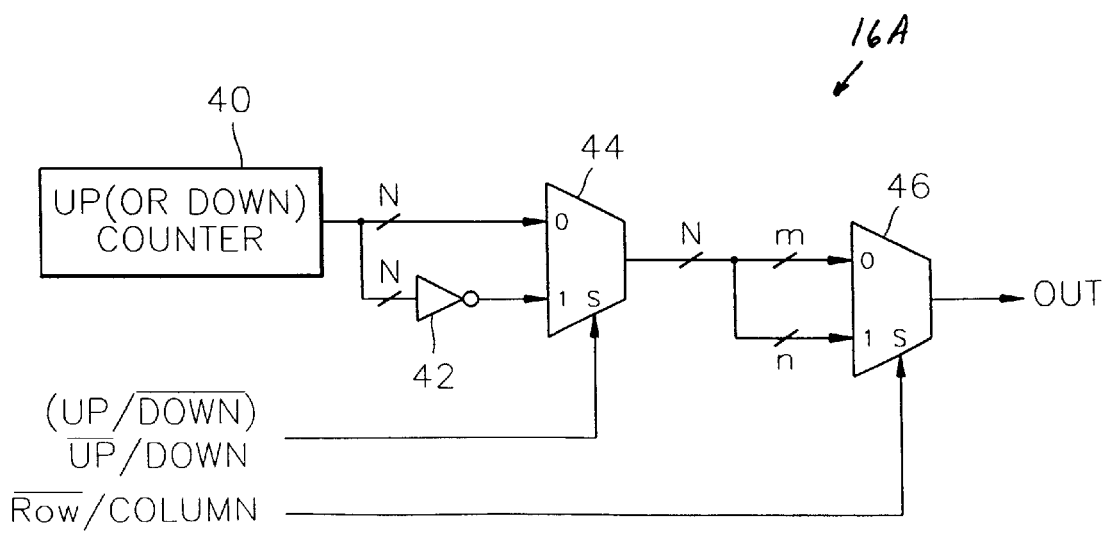
FIG. 2 is a schematic circuit diagram of one embodiment of an address generator according to the present invention.

An address generator 16A for generating addresses for testing a dynamic memory which uses all the available addresses and an address generating method thereof will now be described. FIG. 2 is a schematic circuit diagram of one embodiment of an address generator 16A according to the present invention, which includes an up (or down) counter 40, an inverter 42, a first multiplexer 44 corresponding to a first selecting portion, and a second multiplexer 46 corresponding to a second selecting portion.

Figure 3:
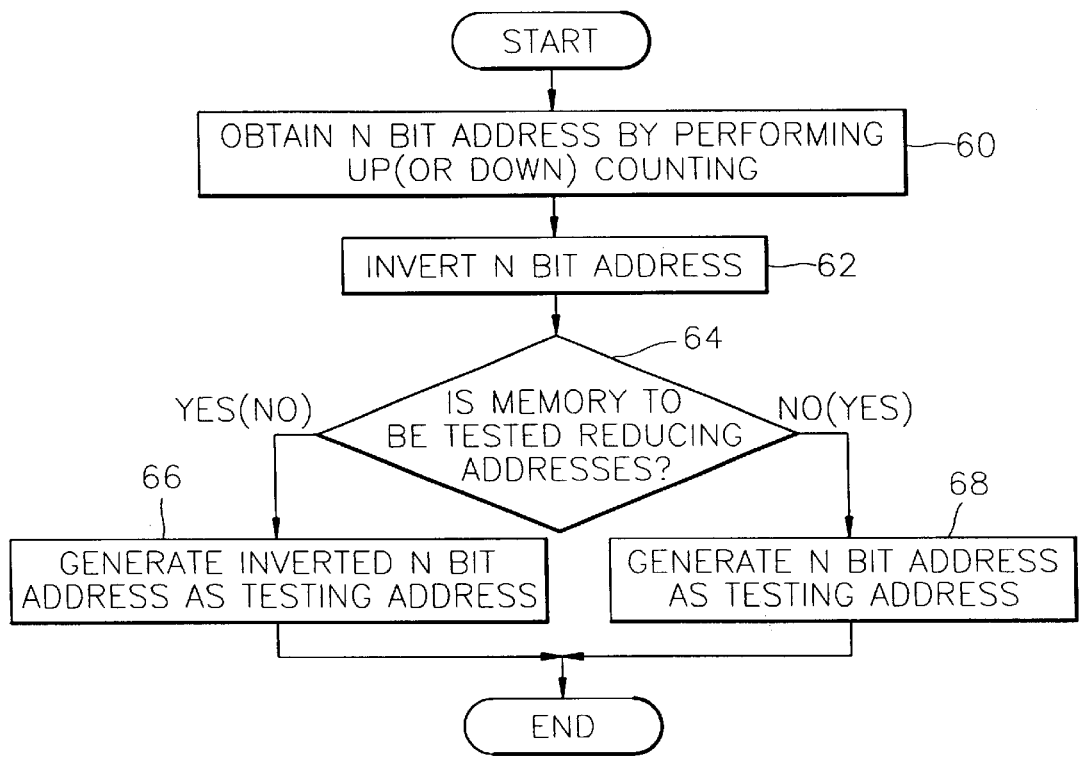
FIG. 3 is a flowchart describing a method for generating addresses according to the present invention which can be performed in the address generator shown in FIG. 2.

FIG. 3 is a flowchart for describing one embodiment of an address generating method according to the present invention, which can be performed in the address generator 16A shown in FIG. 2. In the embodiment of FIG. 3, the method includes the steps of obtaining and inverting N-bit addresses by performing up and down counting operations (steps 60 and 62) and generating tested addresses corresponding to the memory testing method (steps 64 through 68).

Referring to FIGS. 2 and 3, the up (or down) counter 40, which is an N-bit binary counter, performs the up (or down) counting and outputs the counted value as an N-bit address for testing a dynamic memory (not shown) (step 60). N is the number of bits obtained by adding the number of bits of the column and row addresses of the dynamic memory.

In one embodiment, the LSB portion of the counter word is used to address the memory columns and the MSB portion is used to address the rows. In this embodiment, in the case in which the dynamic memory is tested by first running or counting through column addresses and then running through the row addresses, the up (or down) counter 40 up (or down) counts the addresses constructed by the least significant bit (LSB) portion set as the column addresses and the most significant bit (MSB) portion set as the row addresses. However, in the case of testing the dynamic memory by first increasing the row addresses and next increasing the column addresses, the up (or down) counter 40 counts the addresses constructed by the MSB portion set as the column addresses and the LSB portion set as the row addresses.

After the step 60, the inverter 42 receives and inverts the output of the up (or down) counter 40 for the down (or up) counting of the addresses. The inverter 42 transfers the inverted N-bit address to the first multiplexer (MUX) 44 (step 62). Accordingly, addresses generated in an inverse order to the order produced by the up (or down) counter 40 can be obtained. After step 62, the BIST controlling portion 22 shown in FIG. 1 determines whether the dynamic memory is to be tested by decreasing the addresses or increasing the addresses, which is determined by the current stage value input from the stage counter 12 in order to select the address to be input to the dynamic memory (not shown) (step 64).

When the up (or down) counter 40 is an up counter and the dynamic memory is to be tested decreasing the addresses, the BIST controlling portion 22 sets the $\overline{UP}$/DOWN signal to a logic high or "1" value. The first MUX 44 outputs, in response to the high $\overline{UP}$/DOWN signal, the N-bit address inverted in the inverter 42 as a testing address for testing the dynamic memory (step 66). However, in the case of testing the dynamic memory increasing the addresses, the BIST controlling portion 22 sets the $\overline{UP}$/DOWN signal to a logic low or "0" value. The first MUX 44 outputs, in response to the logic low $\overline{UP}$/DOWN value, the N-bit address output from the counter 40 as the testing address (step 68).

Alternatively, in the case that the up (or down) counter 40 is a down counter and the dynamic memory is to be tested decreasing the addresses, the BIST controlling portion 22 sets the UP/$\overline{DOWN}$ signal to a logic 0. The first MUX 44 outputs, in response to the UP/$\overline{DOWN}$ signal at a 0 value, the N-bit address output from counter 40 as the testing address (step 68). However, in the case of testing the dynamic memory by increasing the addresses, the BIST controlling portion 22 generates the UP/$\overline{DOWN}$ signal at a 1 value. The first MUX 44 outputs the inverted N-bit address as the testing address in response to the logic high UP/$\overline{DOWN}$ signal (step 66).

A second MUX 46 receives the testing address selected in the first MUX 44 and selectively outputs a column address of m bits and a row address of n bits to the dynamic memory through an output terminal OUT in response to a $\overline{ROW}$/COLUMN logic signal which is provided as an output from the BIST controlling portion 22.

Figure 4:
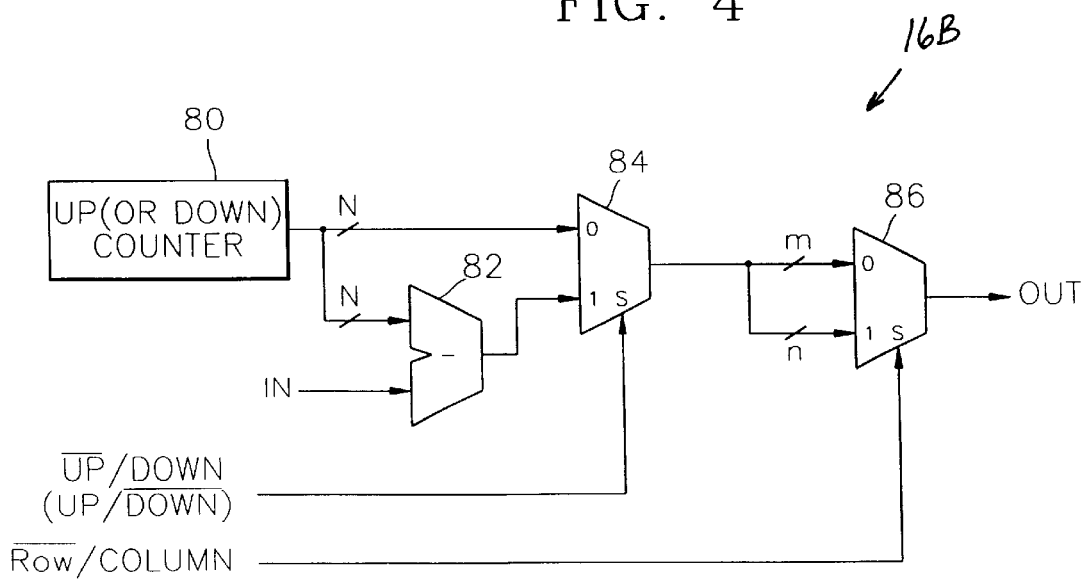
FIG. 4 is a schematic circuit diagram of an alternative embodiment of an address generator according to the present invention.

In accordance with another aspect of the invention, an address generator for testing the dynamic memory which does not use some of the most significant addresses among all the available addresses and an address generating method thereof will now be described in detail. FIG. 4 is a schematic circuit diagram of another embodiment of an address generator 16B according to the present invention, which includes an up (or down) counter 80, a subtracting circuit 82, a first multiplexer 84 corresponding to a first selecting portion, and a second multiplexer 86 corresponding to a second selecting portion.

Figure 5:
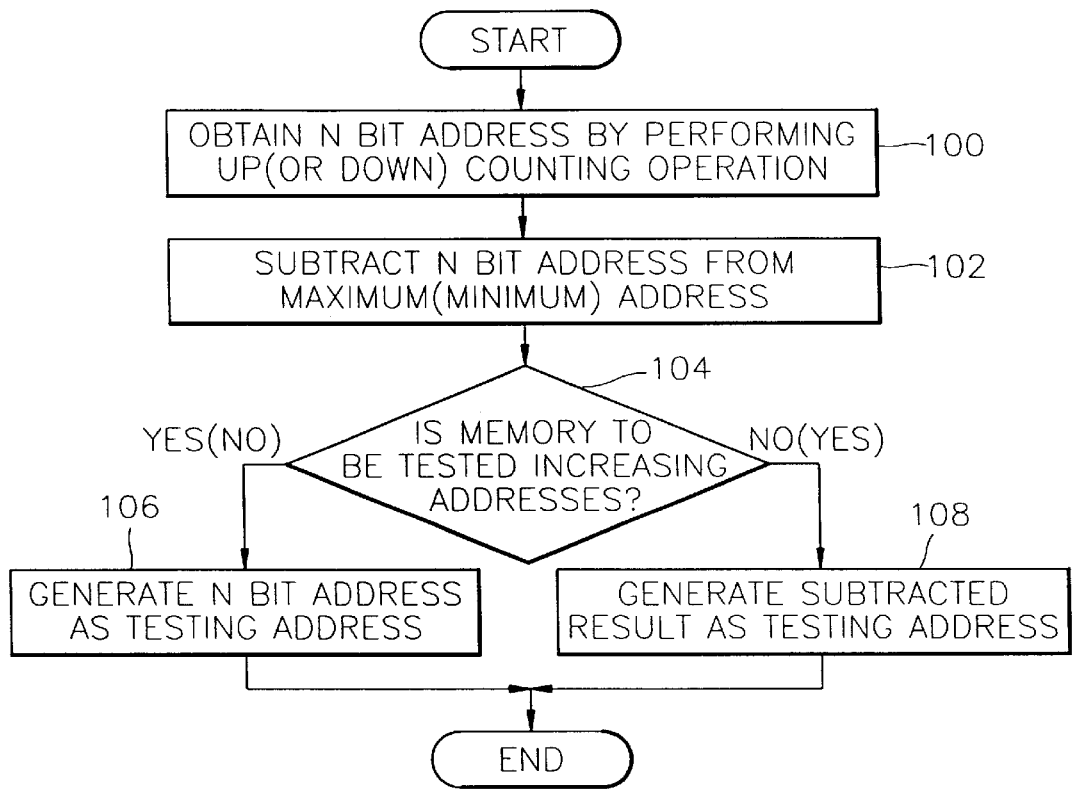
FIG. 5 is a flowchart describing a method for generating addresses according to the present invention which can be performed in the address generator shown in FIG. 4.

FIG. 5 is a flowchart for describing one embodiment of an address generating method according to the present invention, which can be performed in the address generator 16B shown in FIG. 4. In the embodiment of FIG. 5, the method includes the steps of obtaining N-bit addresses by performing the up and down counting operations (steps 100 and 102) and generating the counted addresses in accordance with the memory testing method (steps 104 through 108).

Referring to FIGS. 4 and 5, the up (or down) counter 80, which is an N-bit binary counter, performs the up (or down) counting and outputs the counted value as an N-bit address which can be used in the dynamic memory (not shown) (step 100). In the case of testing the dynamic memory by first increasing the row addresses without using some of the column addresses which are available to the dynamic memory, the up (or down) counter 80 up (or down) counts the N-bit addresses including the LSB portion of the addresses set as the row address and the MSB portion set as the column address to the maximum (or minimum) address. However, in the case of testing the dynamic memory by first increasing the column addresses without using some of the row addresses which are available to the dynamic memory, the up (or down) counter 80 counts the N-bit address including the MSB portion set as the row address and the LSB portion set as the column address to the maximum (or minimum) address.

After step 100, for down-counting (or up-counting) of addresses, the subtracting circuit 82 subtracts the N-bit address counted in the up (or down) counter 80 from the maximum (or minimum) address input through an input terminal IN and outputs the subtracted N-bit address to the first multiplexer (MUX) 84 (step 102). Therefore, the addresses generated in an inverse order from the order of the up (or down) counter 80 is available. After step 102, in order to select an address to be input to the dynamic memory (not shown), the BIST controlling portion 22 shown in FIG. 1 determines, on the basis of the current stage value input from the stage counter 12, whether the dynamic memory should be tested by decreasing or increasing the addresses (step 104).

When the up (or down) counter 80 is an up counter and the dynamic memory is to be tested by decreasing the addresses, the BIST controlling portion 22 generates an $\overline{\text{UP}}$/DOWN signal at a logic high or 1 value. The first MUX 84 outputs, in response to the high $\overline{\text{UP}}$/DOWN signal, the N-bit address subtracted in the subtracting circuit 82 as the testing address for testing the dynamic memory (step log). However, in the case of testing the dynamic memory by increasing the addresses, the BIST controlling portion 22 sets $\overline{\text{UP}}$/DOWN signal to a logic low or 0 value. The first MUX 84 outputs, in response to the low $\overline{\text{UP}}$/DOWN signal, the N-bit address output from the up (or down) counter 80 as the testing address (step 106).

Also, when the up (or down) counter 80 is a down counter and the dynamic memory is to be tested by decreasing the addresses, the BIST controlling portion 22 generates an UP/$\overline{\text{DOWN}}$ signal at a logic low or 0 level. The first MUX 84 outputs, in response to the low $\overline{\text{UP}}$/DOWN signal, the N-bit address output from the up (or down) counter 80 as the testing address (step 106). However, when the dynamic memory is to be tested by increasing the addresses, the BIST controlling portion 22 sets UP/$\overline{\text{DOWN}}$ signal to a logic high or 1 value. The first MUX 84 outputs, in response to the high $\overline{\text{UP}}$/DOWN signal, the N-bit address subtracted in the subtracting circuit 82 as the testing address (step 108).

The second MUX 86 receives the testing address selected in the first MUX 84 and selectively outputs the row address of m bits and the column address of n bits to the dynamic memory through the output terminal OUT in response to a $\overline{\text{ROW}}$/COLUMN signal output from the BIST controlling portion 22.

Hence, in this embodiment of the invention, since some of the most significant addresses among all the available addresses are not used in the memory testing, the address generating circuitry 166B generates addresses referenced to the maximum available memory address. Therefore, the up (or down) counter 80 of the address generating circuitry 16B counts to (or from) the maximum available address.

In accordance with another aspect of the invention, an address generator for testing the dynamic memory which does not use some of the middle addresses among all the available addresses and an address generating method thereof will now be described. In this embodiment, some portion of the addresses between the most significant address and the least significant address, referred to herein as "middle" addresses, are the only address of the dynamic memory that are tested in accordance with the invention.

Figure 6:
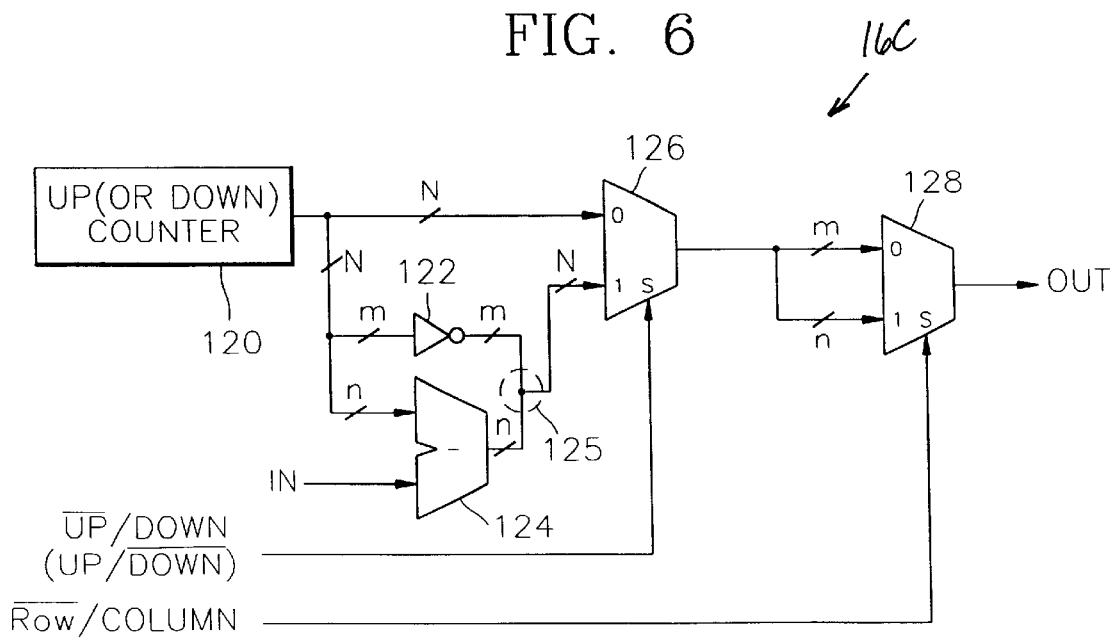
FIG. 6 is a circuit diagram of another alternative embodiment of an address generator according to the present invention.

FIG. 6 is a schematic circuit diagram of another embodiment of the address generator 16C according to the present invention. The address generator 16C includes an up (or down) counter 120, an inverter 122, a subtracting circuit 124, a first multiplexer 126 corresponding to a first selecting portion, and a second multiplexer 128 corresponding to a second selecting portion.

Figure 7:
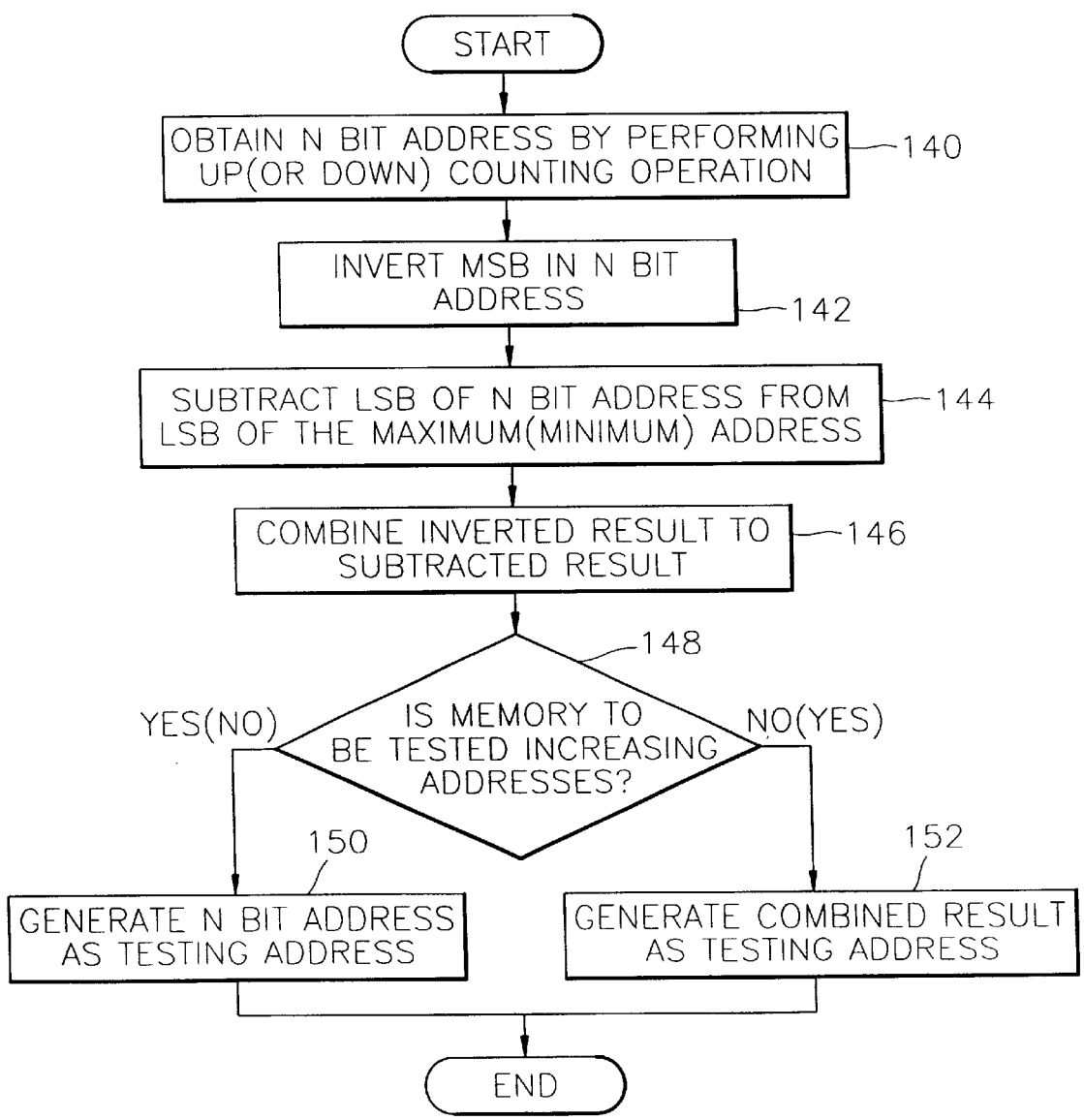
FIG. 7 is a flowchart describing a method for generating addresses according to the present invention which can be performed in the address generator shown in FIG. 6.

FIG. 7 is a flowchart for describing one embodiment of an address generating method according to the present invention, which can be performed in the address generator 16C shown in FIG. 6. In the embodiment of FIG. 7, the method includes the steps of obtaining N-bit addresses by performing an up (or down) counting operation (step 140), performing a down (or up) counting operation (steps 142 through 146), and generating the counted addresses in accordance with the memory testing method (steps 148 through 152).

Referring to FIGS. 6 and 7, the up (or down) counter 120, which is an N-bit binary counter, performs the up (or down) counting and outputs the counted value as the N-bit address which can be used in the dynamic memory (not shown) (step 140). In step 140, when the dynamic memory is to be tested by first increasing the column address without using some of the column addresses which are available to the dynamic memory, the up (or down) counter 120 counts the N-bit address constructed by the LSB portion set as the column address and the MSB portion set as the row address. However, in the case of testing the dynamic memory by first increasing the row addresses without using some of the row addresses, the up (or down) counter 120 counts the N-bit addresses constructed by the MSB side set as the column addresses and the LSB side set as the row addresses.

After step 140, the inverter 122 and the subtracter 124 generate addresses in the inverse order (steps 142 through 146). Namely, the inverter 122 inverts m bits of the MSB side among the N-bit addresses counted in the counter 120 (step 142). After the step of 142, the subtracter 124 subtracts n bits of the LSB side of the N-bit addresses counted in the up (or down) counter 120 from n bits of the LSB side of the maximum (or minimum) address input through the input terminal IN (step 144). After the step 144, the subtracted n bits and the inverted m bits are combined in a node 125. The obtained result is output to the first multiplexer (MUX) 126 as the N-bit addresses (step 146). After the step 146, in order to select the addresses to be input to the dynamic memory (not shown), the BIST controlling portion 22 shown in FIG. 1 determines whether the dynamic memory is to be tested by decreasing or increasing the addresses, which is determined by the current stage value input from the stage counter 12 (step 48).

When the up (or down) counter 120 is an up counter and the dynamic memory is to be tested by decreasing the addresses, the BIST controlling portion 22 sets an $\overline{\text{UP}}$/DOWN signal at a logic high or 1 value. The first MUX 126 outputs the combined N-bit addresses as the testing address for testing the dynamic memory, in response to the high $\overline{\text{UP}}$/DOWN signal (step 152). However, in the case of testing the dynamic memory by increasing the addresses, the BIST controlling portion 22 sets the $\overline{\text{UP}}$/DOWN signal to a logic low or 0 value. The first MUX 126 outputs the N-bit addresses output from the up (or down) counter 120 as the testing address in response to the low $\overline{\text{UP}}$/DOWN signal (step 150).

Also, when the up (or down) counter 120 is a down counter and the dynamic memory is to be tested by increasing the addresses, the BIST controlling portion 22 sets an UP/$\overline{\text{DOWN}}$ signal to a logic low or 0 value. The first MUX 126 outputs the N-bit addresses output from the up(or down) counter 120 as the testing address, in response to the low UP/$\overline{\text{DOWN}}$ signal. However, when the dynamic memory is to be tested by increasing the addresses, the BIST controlling portion 22 sets the UP/$\overline{\text{DOWN}}$ signal to a logic high or 1 value. The first MUX 126 outputs the inverted N-bit addresses as the testing address, in response to the high UP/$\overline{\text{DOWN}}$ signal (step 152).

The second MUX 128 receives the testing address output from the first MUX 126 and selectively outputs the row addresses of m bits and the column addresses of n bits to the dynamic memory through the output terminal OUT, in response to the $\overline{\text{ROW}}$/COLUMN signal output from the BIST controlling portion 22.

While this invention has been particularly shown and described with references to preferred embodiments thereof, it will be understood by those skilled in the art that various changes in form and details may be made therein without departing from the spirit and scope of the invention as defined in the following claims.

What is claimed is:

1. An apparatus for generating memory addresses in a dynamic memory testing circuit for testing a dynamic memory using all available addresses of the dynamic memory, comprising:

a single N-bit binary counter for performing counting operation and for generating a first sequence of N-bit counted value words as addresses used by the dynamic memory, wherein N is the number obtained by adding the number of bits of the row address of the dynamic memory to the number of bits of the column address of the dynamic memory, values of counted value words in the first sequence of counted value words changing in succession in a first direction;

inverting means for inverting the counted value words to generate a second sequence of N-bit inverted value words, values of inverted value words in the second sequence of inverted value words changing in succession in a second direction opposite to the first direction, such that the first and second sequences of words changing in the first and second directions are generated using the single counter; and first selecting means for selectively forwarding to the dynamic memory one of an inverted value word from the second sequence and a counted value word from the first sequence in response to a first select signal used to control the first selecting means.

2. The apparatus of claim 1 wherein the single N-bit binary counter is an up counter.

3. The apparatus of claim 2, further comprising second selecting means for selectively outputting to the dynamic memory one of the row and column addresses generated from the first selecting means, in response to a second select signal.

4. The apparatus of claim 2, wherein, when the column address of the dynamic memory is to be generated, the single N-bit binary up counter outputs the most significant bit (MSB) portion of an N-bit counted value word as the row address and the least significant bit (LSB) portion of the N-bit counted value word as the column address.

5. The apparatus of claim 2, wherein, when the row address of the dynamic memory is to be generated, the single N-bit binary up counter outputs the LSB portion of an N-bit counted value word as the row address and the MSB portion of the N-bit counted value word as the column address.

6. The apparatus of claim 1 wherein the single N-bit binary counter is a down counter.

7. The apparatus of claim 6, further comprising second selecting means for selectively outputting to the dynamic memory one of the row and column addresses generated from the first selecting means, in response to a second select signal.

8. The apparatus of claim 6, wherein, when the column address of the dynamic memory is to be generated, the single N-bit binary down counter outputs the MSB portion of an N-bit counted value word as the row address and the LSB portion of the N-bit counted value word as the column address.

9. The apparatus of claim 6, wherein, when the row address of the dynamic memory is to be generated, the single N-bit binary down counter outputs the LSB portion of an N-bit counted value word as the row address and the MSB portion of the N-bit counted value word as the column address.

10. An apparatus for generating memory addresses in a dynamic memory testing circuit for testing a dynamic memory which does not use some of its most significant addresses comprising:

a single N-bit binary up counter for performing an up counting operation and for generating a first sequence of N-bit counted value words as addresses used by the dynamic memory, wherein N is the number of bits obtained by adding the number of bits of the row addresses of the dynamic memory to the number of bits of the column addresses of the dynamic memory, values of counted value words in the first sequence of counted value words increasing in succession;

subtracting means for subtracting the counted value words from a maximum address of the dynamic memory to generate a second sequence of N-bit subtracted value words, values of subtracted value words in the second sequence of subtracted value words decreasing in succession, such that the first and second sequences of words are generated using the single counter; and first selecting means for selectively outputting to the dynamic memory one of a subtracted value word from the second sequence and a counted value word from the first sequence in response to a first select signal used to control the first selecting means.

11. The apparatus of claim 10, further comprising second selecting means for selectively outputting to the dynamic memory one of the row and column addresses generated from the first selecting means, in response to a second select signal.

12. The apparatus of claim 10, wherein, when the column address of the dynamic memory is to be generated, the single N-bit binary up counter outputs the MSB portion of a counted value word as the row address and the LSB portion of the counted value word as the column address.

13. The apparatus of claim 10, wherein, when the row address of the dynamic memory is to be generated, the single N-bit binary up counter outputs the LSB portion of an N-bit counted value word as the row address and the MSB portion of the N-bit counted value word as the column address.

14. An apparatus for generating addresses in a dynamic memory testing circuit for testing a dynamic memory which does not use some of its most significant addresses, comprising:

a single N-bit binary down counter for performing a down counting operation and for generating a first sequence of N-bit counted value words as addresses used by the dynamic memory, wherein N is the number of bits obtained by adding the number of bits of the row addresses of the dynamic memory to the number of bits of the column addresses of the dynamic memory, values of counted value words in the first sequence of counted value words changing in succession in a first direction;

subtracting means for subtracting the counted value words from a minimum address of the dynamic memory to generate a second sequence of subtracted value words of N bits, values of subtracted value words in the second sequence of subtracted value words increasing in succession, such that the first and second sequences of words are generated using the single counter; and first selecting means for selectively outputting to the dynamic memory one of a subtracted value word from the second sequence and a counted value word from the first sequence in response to a first select signal used to control the first selecting means.

15. The apparatus of claim 14, further comprising second selecting means for selectively outputting to the dynamic memory one of the row and column addresses generated from the first selecting means, in response to a second select signal.

16. The apparatus of claim 14, wherein, when the column address of the dynamic memory is to be generated, the single N-bit binary down counter outputs the MSB portion of an N-bit counted value word as the row address and the LSB portion of the N-bit counted value word as the column address.

17. The apparatus of claim 14, wherein, when the row address of the dynamic memory is to be generated, the single N-bit binary down counter outputs the LSB portion of an N-bit counted value word as the row address and the MSB portion of the N-bit counted value word as the column address.

18. An apparatus for generating memory addresses in a dynamic memory testing circuit for testing a dynamic memory which does not use some of its middle addresses among all of its available addresses, said middle addresses being between a minimum address and a maximum address used by said dynamic memory, said apparatus comprising:

a single N-bit binary up counter for performing an up counting operation and for generating a first sequence of N-bit counted value words as addresses used by the dynamic memory, wherein N is the number of bits obtained by adding the number of bits of the row addresses of the dynamic memory to the number of bits of the column addresses of the dynamic memory, values of counted value words in the first sequence of counted value words increasing in succession;

inverting means for inverting the MSB portions of the counted value words to generate a second sequence of MSB inverted value words, values of words in the second sequence of MSB inverted value words decreasing;

subtracting means for subtracting the LSB portions of the counted value words from the LSB portion of the maximum address used in the dynamic memory to generate a third sequence of LSB subtracted value words, values of words in the third sequence of LSB inverted value words decreasing in succession, such that the first, second and third sequences of words are generated using the single counter;

bit combining means for combining the MSB inverted value words with the LSB subtracted value words to generate a fourth sequence of combined words; and first selecting means for selectively outputting to the dynamic memory one of a combined word from the fourth sequence and an N-bit counted value word from the first sequence in response to a first select signal used to control the first selecting means.

19. The apparatus of claim 18, further comprising second selecting means for selectively outputting to the dynamic memory one of the row and column addresses generated from the first selecting means, in response to a second select signal.

20. The apparatus of claim 18, wherein, when the column address of the dynamic memory is to be generated, the single N-bit binary up counter outputs the MSB portion of an N-bit counted value word as the row address and the LSB portion of the N-bit counted value word as the column address.

21. The apparatus of claim 18, wherein, when the row address of the dynamic memory is to be generated, the single N-bit binary up counter outputs the LSB portion of an N-bit counted value word as the row address and the MSB portion of the N-bit counted value word as the column address.

22. An apparatus for generating memory addresses in a dynamic memory testing circuit for testing a dynamic memory which does not use some of its middle addresses among all of its available addresses, said middle addresses being between a minimum address and a maximum address used by said dynamic memory, said apparatus comprising:

a single N-bit binary down counter for performing a down counting operation and for generating a first sequence of N-bit counted value words as addresses used by the dynamic memory, wherein N is the number of bits obtained by adding the number of bits of the row addresses of the dynamic memory to the number of bits of the column addresses of the dynamic memory, values of counted value words in the first sequence of counted value words decreasing in succession;

inverting means for inverting the MSB portions of counted value words to generate a second sequence of MSB inverted value words, values of words in the second sequence of MSB inverted value words increasing in succession;

subtracting means for subtracting the LSB portions of the counted value words from the LSB portion of the minimum address used in the dynamic memory to generate a third sequence of LSB subtracted value words, values of words in the third sequence of LSB subtracted value words decreasing in succession, such that the first, second and third sequences of words are generated using the single counter;

bit combining means for combining the MSB inverted value words with the LSB subtracted value words to generate a fourth sequence of combined words; and first selecting means for selectively outputting to the dynamic memory one of a combined word from the fourth sequence and an N-bit counted value word from the first sequence in response to a first select signal used to control the first selecting means.

23. The apparatus of claim 22, further comprising second selecting means for selectively outputting to the dynamic memory one of the row and column addresses generated from the first selecting means, in response to a second select signal.

24. The apparatus of claim 22, wherein, when the column address of the dynamic memory is to be generated, the single N-bit binary down counter outputs the MSB portion of an N-bit counted value word as the row address and the LSB portion of the N-bit counted value word as the column address.

25. The apparatus of claim 22, wherein, when the row address of the dynamic memory is to be generated, the single N-bit binary down counter outputs the LSB portion of an—bit counted value word as the row address and the MSB portion of the N-bit counted value word as the column address.

26. A method for generating addresses in a dynamic memory testing circuit for testing a dynamic memory which uses all available addresses of the dynamic memory, comprising:

(a) obtaining a first sequence of counted N-bit addresses used by the dynamic memory by performing an up counting operation with a single N-bit counter, wherein N is the number of bits obtained by adding the number of bits of the row addresses of the dynamic memory to the number of bits of the column addresses of the dynamic memory, values of the counted N-bit addresses of the first sequence increasing in succession;

(b) inverting the counted N-bit addresses to form a second sequence of inverted addresses, values of the inverted addresses of the second sequence decreasing in succession, such that the first and second sequences are generated using the single counter;

(c) determining whether the dynamic memory is to be tested by increasing or decreasing addresses;

(d) providing the N-bit addresses of the first sequence as addresses for testing the dynamic memory where the dynamic memory is tested by increasing the addresses; and (e) providing the inverted N-bit addresses of the second sequence as addresses for testing the dynamic memory where the dynamic memory is to be tested by decreasing the addresses.

27. The method of claim 26, further comprising:

following step (e), determining whether a row address or a column address is to be generated;

selecting the row address from the addresses for testing the dynamic memory when the row address is to be generated; and selecting the column address from the addresses for testing the dynamic memory when the column address is to be generated.

28. A method for generating addresses in a dynamic memory testing circuit for testing a dynamic memory which uses all available addresses of the dynamic memory, comprising:

(a) performing a down counting operation with a single counter to generate a first sequence of N-bit counted addresses used by the dynamic memory, wherein N is the number of bits obtained by adding the number of bits of the row addresses of the dynamic memory to the number of the column addresses of the dynamic memory, values of the N-bit counted addresses of the first sequence decreasing in succession;

(b) inverting the counted N-bit addresses to generate a second sequence of inverted N-bit addresses, values of the inverted addresses of the second sequence increasing in succession, such that the first and second sequences are generated using the single counter;

(c) determining whether the dynamic memory is to be tested by increasing or decreasing addresses;

(d) providing the inverted N-bit addresses of the second sequence as addresses for testing the dynamic memory in the case of testing the dynamic memory by increasing the addresses; and (e) providing the N-bit counted addresses of the first sequence as addresses for testing the dynamic memory in the case of testing the dynamic memory by decreasing the addresses.

29. The method of claim 28, wherein the method for generating addresses further comprises:

following step (e), determining whether a row address or a column address is to be generated;

selecting the row address from addresses for testing the dynamic memory when the row address is to be generated; and selecting the column address from addresses for testing the dynamic memory when the column address is to be generated.

30. A method for generating memory addresses in a dynamic memory testing circuit for testing a dynamic memory which does not use some of its most significant addresses, comprising:

(a) obtaining a first sequence of N-bit addresses used by the dynamic memory by performing an up counting operation with a single N-bit counter, wherein N is the number of bits obtained by adding the number of bits of the row addresses of the dynamic memory to the number of bits of the column addresses of the dynamic memory, values of the counted N-bit addresses of the first sequence increasing in succession;

(b) subtracting the N-bit address from a maximum address of the dynamic memory to generate a second sequence of subtracted value words of N-bits, values of the second sequence of subtracted value words decreasing in succession, such that the first and second sequences are generated using the single counter;

(c) determining whether the dynamic memory is to be tested by increasing or decreasing the addresses;

(d) providing an N-bit address of the first sequence as an address for testing the dynamic memory when the dynamic memory is to be tested by increasing the addresses; and (e) providing a subtracted value word of the second sequence as an address for testing the dynamic memory when the dynamic memory is to be tested by decreasing the addresses.

31. The method of claim 30, further comprising:

following step (e), determining whether the row address or the column address is to be generated;

selecting the row address from the addresses for testing the dynamic memory when the column address is to be generated; and selecting the column address from the addresses for testing the dynamic memory when the column address is to be generated.

32. A method for generating memory addresses in a dynamic memory testing circuit for testing a dynamic memory which does not use some of its most significant addresses, comprising:

(a) obtaining a first sequence of N-bit addresses used by the dynamic memory by performing a down counting operation with a single N-bit counter, wherein N is the number of bits obtained by adding the number of bits of the row addresses of the dynamic memory to the number of bits Of the column addresses of the dynamic memory, values of the addresses of the first sequence decreasing in succession;

(b) subtracting the N-bit addresses of the first sequence from a minimum address of the dynamic memory to generate a second sequence of subtracted value words of N-bits, values of the subtracted value words of the second sequence increasing in succession, such that the first and second sequences are generated using the single counter;

(c) determining whether the dynamic memory is to be tested by increasing or decreasing the addresses;

(d) providing a subtracted value word of the second sequence as an address for testing the dynamic memory when the dynamic memory is tested by increasing the addresses; and (e) providing an N-bit address of the first sequence as an address for testing the dynamic memory when the dynamic memory is tested by decreasing the addresses.

33. The method of claim 32, further comprising:

following step (e), determining whether the row address or the column address is to be generated;

selecting the row address from the addresses for testing the dynamic memory when the row address is to be generated; and selecting the column address from the addresses for testing the dynamic memory when the column address is to be generated.

34. A method for generating memory addresses in a dynamic memory testing circuit for testing a dynamic memory which does not use some of its middle addresses among all of its available addresses, said middle addresses being between a minimum address and a maximum address of said dynamic memory, said method comprising:

(a) obtaining a first sequence of N-bit addresses used by the dynamic memory by performing an up counting operation with a single N-bit counter, wherein N is the number of bits obtained by adding the number of bits of the row addresses of the dynamic memory to the number of bits of the column addresses of the dynamic memory, values of the addresses of the first sequence increasing in succession;

(b) inverting the MSB portions of the N-bit addresses to generate a second sequence of MSB inverted words, values of the MSB inverted words of the second sequence decreasing in succession;

(c) subtracting the LSB portions of the N-bit addresses from the LSB portions of the maximum address used by the dynamic memory to generate a third sequence of LSB subtracted value words, values of the LSB subtracted value words of the third sequence decreasing in succession, such that the first, second, and third sequences are generated using the single counter;

(d) combining the MSB inverted words of the second sequence with the LSB subtracted words of the third sequence to generate a fourth sequence of combined words:

(e) determining whether the dynamic memory is to be tested by increasing or decreasing addresses;

(f) providing an N-bit address of the first sequence as an address for testing the dynamic memory when the dynamic memory is tested by increasing the addresses; and (g) providing a combined word of the fourth sequence as an address for testing the dynamic memory when the dynamic memory is tested by decreasing the addresses.

35. The method of claim 34, further comprising:

following step (g), determining whether the row address or the column address is to be generated;

selecting the row address from addresses for testing the dynamic memory when the row address is to be generated; and selecting the column address from addresses for testing the dynamic memory when the column address is to be generated.

36. A method for generating memory addresses in a dynamic memory testing circuit for testing a dynamic memory which does not use some of its middle addresses among all its available addresses, said middle addresses being between a minimum address and a maximum address of said dynamic memory, said method comprising:

(a) obtaining a first sequence of N-bit addresses used by the dynamic memory by performing a down counting operation with a single N-bit counter, wherein N is the number of bits obtained by adding the number of bits of the row addresses of the dynamic memory to the number of bits of the column addresses of the dynamic memory, values of the addresses of the first sequence decreasing in succession;

(b) inverting the MSB portions of the N-bit addresses to generate a second sequence of MSB inverted words, values of the MSB inverted words of the second sequence increasing in succession;

(c) subtracting the LSB portions of the N-bit addresses from the LSB portions of the minimum address used in the dynamic memory to generate a third sequence of LSB subtracted value words, values of the LSB subtracted value words of the third sequence increasing in succession such that first, second, and third sequences are generating using the single care;

(d) combining the MSB inverted words of the second sequence with the LSB subtracted words of the third sequence to generate a fourth sequence of combined words;

(e) determining whether the dynamic memory is to be tested by increasing or decreasing addresses;

(f) providing a combined word of the fourth sequence as an address for testing the dynamic memory, when the dynamic memory is tested by increasing the addresses; and (g) providing an N-bit address of the first sequence as an address for testing the dynamic memory when the dynamic memory is tested by decreasing the addresses.

37. The method of claim 36, further comprising:

following step (g), determining whether the row address or the column address is to be generated;

selecting the row address from addresses for testing the dynamic memory when the row address is to be generated; and selecting the column address from addresses for testing the dynamic memory when the column address is to be generated.

* * * * *